US012699217B2

(12) United States Patent
Kang et al.

(10) Patent No.: US 12,699,217 B2
(45) Date of Patent: Aug. 4, 2026

(54) DISPLAY DEVICE HAVING FOLDING AREA AND POLARIZATION FILM WITH DEFORMATION PORTION

(71) Applicant: SAMSUNG DISPLAY CO., LTD., Yongin-si (KR)

(72) Inventors: Kuhyun Kang, Suwon-si (KR); Muhyun Kim, Seoul (KR); Geunwoo Yug, Seoul (KR); Seoin Han, Cheonan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 293 days.

(21) Appl. No.: 18/393,881

(22) Filed: Dec. 22, 2023

(65) Prior Publication Data

US 2024/0118475 A1 Apr. 11, 2024

Related U.S. Application Data

(62) Division of application No. 16/814,189, filed on Mar. 10, 2020, now Pat. No. 11,874,483.

(30) Foreign Application Priority Data

Apr. 18, 2019 (KR) ........................ 10-2019-0045414

(51) Int. Cl.
*G02B 5/30* (2006.01)
*G02F 1/1333* (2006.01)
(Continued)

(52) U.S. Cl.
CPC ......... *G02B 5/3033* (2013.01); *G02B 5/3041* (2013.01); *G06F 1/1641* (2013.01);
(Continued)

(58) Field of Classification Search
CPC ............. G02F 1/133305; G06F 1/1609; G06F 1/1652; G06F 1/1641; G06F 2203/04102;
(Continued)

(56) References Cited

U.S. PATENT DOCUMENTS 8,356,393 B2 * 1/2013 Moriyama ............ C08F 114/22
29/25.35
9,423,915 B2 8/2016 Kang et al.
(Continued)

FOREIGN PATENT DOCUMENTS

CN 104345975 A 2/2015
CN 106796465 A 5/2017
(Continued)

OTHER PUBLICATIONS

Office Action issued Apr. 22, 2024 in Korean Application No. 10-2019-0045414, 15 pages.
(Continued)

*Primary Examiner* — Ryan S Dunning
(74) *Attorney, Agent, or Firm* — CANTOR COLBURN LLP

(57) ABSTRACT

A polarization film includes: a base substrate in which a folding axis and a stretched axis are defined; and a deformation portion located at an edge of the base substrate. The stretched axis forms an angle of less than about 45° with respect to the folding axis. The display device, in which a folding area at which a folding axis is located and a non-folding area neighboring the folding area are defined, includes a display panel; a first adhesive layer on the display panel; and a polarization film on the first adhesive layer, where a stretched axis is defined in the polarization film. An angle between the folding axis and the stretched axis is less than about 45°.

16 Claims, 12 Drawing Sheets

(51) Int. Cl.

| | | |
|---|---|---|
| *G02F 1/1335* | (2006.01) | |
| *G06F 1/16* | (2006.01) | |
| *G09F 9/30* | (2006.01) | |
| *H10K 59/80* | (2023.01) | |
| *H10K 102/00* | (2023.01) | |

(52) U.S. Cl.
CPC ............ *G06F 1/1652* (2013.01); *G09F 9/301* (2013.01); *G02F 1/133305* (2013.01); *G02F 1/133528* (2013.01); *H10K 59/8791* (2023.02); *H10K 2102/311* (2023.02)

(58) Field of Classification Search
CPC ................ G09F 9/301; H01L 51/0097; H01L 2251/5338; H04M 1/0268
See application file for complete search history.

(56) References Cited

U.S. PATENT DOCUMENTS

| | | | |
|---|---|---|---|
| 10,217,968 B2 | 2/2019 | Okuno et al. | |
| 10,222,834 B2 | 3/2019 | Choi et al. | |
| 11,888,205 B2 * | 1/2024 | Pandey | .................... H01Q 1/38 |
| 2012/0320509 A1 | 12/2012 | Kim et al. | |
| 2015/0090702 A1 | 4/2015 | Ban et al. | |
| 2016/0202403 A1 | 7/2016 | Mathew et al. | |
| 2017/0200915 A1 | 7/2017 | Lee et al. | |
| 2017/0277291 A1 | 9/2017 | Lee et al. | |
| 2017/0294495 A1 | 10/2017 | Shyu et al. | |
| 2017/0317314 A1 | 11/2017 | Okuno et al. | |
| 2018/0313991 A1 | 11/2018 | Yug et al. | |
| 2019/0027707 A1 * | 1/2019 | Yu | ........................ G02B 5/3025 |
| 2021/0179794 A1 | 6/2021 | Yoshino et al. | |

FOREIGN PATENT DOCUMENTS

| | | |
|---|---|---|
| CN | 107153232 A | 9/2017 |
| CN | 107343335 A | 11/2017 |
| CN | 108802884 A | 11/2018 |
| EP | 3264147 A1 | 12/2016 |
| KR | 1020130119173 A | 10/2013 |
| KR | 1020150045076 A | 4/2015 |
| KR | 1020160036466 A | 4/2016 |
| KR | 101682269 B1 | 11/2016 |
| KR | 1020170106599 A | 9/2017 |
| KR | 1020180061484 A | 6/2018 |
| KR | 1020180121751 A | 11/2018 |
| KR | 101938413 B1 | 1/2019 |
| KR | 1020190000967 A | 1/2019 |

OTHER PUBLICATIONS

Office Action issued Mar. 25, 2024 in Chinese Application No. 202010304145.6, 19 pages.
Extended European Search Report for Application No. 20169529.3-1020 dated Aug. 18, 2020.

* cited by examiner

*312:313,314
*310:311,312
*320:321,322

DISPLAY DEVICE HAVING FOLDING AREA AND POLARIZATION FILM WITH DEFORMATION PORTION

This application is a divisional of U.S. patent application Ser. No. 16/814,189, filed on Mar. 10, 2020, which claims priority to Korean Patent Application No. 10-2019-0045414, filed on Apr. 18, 2019, and all the benefits accruing therefrom under 35 U.S.C. § 119, the content of which in its entirety is herein incorporated by reference.

BACKGROUND

1. Field

Embodiments of the invention relate to a polarization film and a display device including the polarization film, and more particularly, to a polarization film in which damages in a folding area in a process of manufacturing a foldable display device are substantially minimized and to a display device including the polarization film.

2. Discussion of Related Art

In general, a display device such as a liquid crystal display ("LCD") device, an electro-wetting display device, an electrophoretic display device, and an organic light emitting diode ("OLED") display device may include a display panel for displaying images, and a polarization layer unitarily formed with or provided on one surface of the display panel.

The polarization layer may effectively prevent reflection of external light of the display device or improve display quality of the display device.

SUMMARY

Embodiments of the invention are directed to a polarization film in which damages in a folding area in a process of manufacturing a foldable display device are minimized and to a display device including the polarization film.

According to an embodiment, a polarization film includes: a base substrate in which a folding axis and a stretched axis are defined; and a deformation portion located at an edge of the base substrate. In such an embodiment, the stretched axis forms an angle of less than about 45° with the folding axis.

In an embodiment, the base substrate may include: a linear polarization layer in which the stretched axis is defined; and a phase retardation layer on the linear polarization layer.

In an embodiment, the stretched axis may be parallel to the folding axis.

In an embodiment, the folding axis may form an angle of less than about 135° with a light transmission axis of the linear polarization layer.

In an embodiment, the folding axis may form an angle of less than about 45° with a light absorption axis of the linear polarization layer.

In an embodiment, the phase retardation layer may include at least one of a ½λ phase retardation layer and a ¼λ phase retardation layer.

In an embodiment, the phase retardation layer may be disposed on a surface of the linear polarization layer.

In an embodiment, the deformation portion may include: a first deformation portion extending in a direction perpendicular to the folding axis; and a second deformation portion extending in a direction parallel to the folding axis.

In an embodiment, the second deformation portion may have a width greater than a width of the first deformation portion.

In an embodiment, the second deformation portion may have a width substantially equal to or greater than about 70 micrometers (μm) and substantially equal to or less than about 80 μm.

In an embodiment, the first deformation portion may include a thermally denatured portion and a color shifting portion arranged from an edge of the linear polarization layer to a center portion thereof when viewed from a plan view in a thickness direction of the polarization film.

In an embodiment, the first deformation portion may include a thermally denatured portion, a color shifting portion, and a first recessed portion arranged from an edge of the linear polarization layer to a center portion thereof when viewed from a plan view in a thickness direction of the polarization film.

In an embodiment, the first recessed portion may have a size of less than about 30 μm.

In an embodiment, the second deformation portion may include a thermally denatured portion, a color shifting portion, and a second recessed portion arranged, on a plane, from an edge of the linear polarization layer to a center portion thereof when viewed from the plan view in the thickness direction of the polarization film.

In an embodiment, the second recessed portion may have a plurality of recesses arranged with regular intervals.

In an embodiment, the second recessed portion may have a size substantially equal to or greater than about 30 μm and substantially equal to or less than about 40 μm.

In an embodiment, the first recessed portion may have a width less than a width of the second recessed portion.

According to an embodiment, a polarization film includes: a base substrate including: a folding area in a folding axis is defined, and a non-folding area neighboring the folding area, where a stretched axis is defined in the base substrate to be in an angle of less than about 45° with respect to the folding axis; and a deformation portion located at an edge of the base substrate. In such an embodiment, the deformation portion has a greater width in the non-folding area than a width thereof in the folding area.

In an embodiment, the stretched axis may be parallel to the folding axis.

In an embodiment, the deformation portion may include: a first deformation portion extending in a direction perpendicular to the folding axis; and a second deformation portion extending in a direction parallel to the folding axis.

In an embodiment, the second deformation portion may have a width greater than a width of the first deformation portion.

According to an embodiment, a polarization film includes: a base substrate including: a folding area in which a folding axis is defined; and a non-folding area neighboring the folding area, where a stretched axis is defined in the base substrate to be in an angle of less than about 45° with respect to the folding axis; and a deformation portion located at an edge of the base substrate. In such an embodiment, the folding area has a width less than a width of the non-folding area.

In an embodiment, the deformation portion may not be disposed at the folding area.

In an embodiment, the deformation portion may include: a first deformation portion extending in a direction perpendicular to the folding axis; and a second deformation portion extending in a direction parallel to the folding axis.

In an embodiment, the second deformation portion may have a width greater than a width of the first deformation portion.

According to an embodiment, a display device includes: a display panel including: a folding area in which a folding axis is defined, and a non-folding area neighboring the folding area; a first adhesive layer on the display panel; and a polarization film on the first adhesive layer, where a stretched axis is defined in the polarization film. In such an embodiment, an angle between the folding axis and the stretched axis is less than about 45°.

In an embodiment, the polarization film may include: a base substrate in which the stretched axis is defined; and a deformation portion located at an edge of the base substrate. In such an embodiment, the base substrate may include: a linear polarization layer in which the stretched axis is defined; and a phase retardation layer on the linear polarization layer.

In an embodiment, the deformation portion may include: a first deformation portion extending in a direction perpendicular to the folding axis; and a second deformation portion extending in a direction parallel to the folding axis.

In an embodiment, the first deformation portion is not disposed at the folding area located at the edge of the base substrate.

In an embodiment, the second deformation portion may have a width greater than a width of the first deformation portion.

In an embodiment, the second deformation portion may have a plurality of recesses arranged at regular intervals.

The foregoing is illustrative only and is not intended to be in any way limiting. In addition to the illustrative aspects, embodiments and features described above, further aspects, embodiments and features will become apparent by reference to the drawings and the following detailed description.

BRIEF DESCRIPTION OF THE DRAWINGS

These and/or other features of embodiments of the invention will become apparent and more readily appreciated from the following description of the embodiments, taken in conjunction with the accompanying drawings, in which.

DETAILED DESCRIPTION

Figure 1:
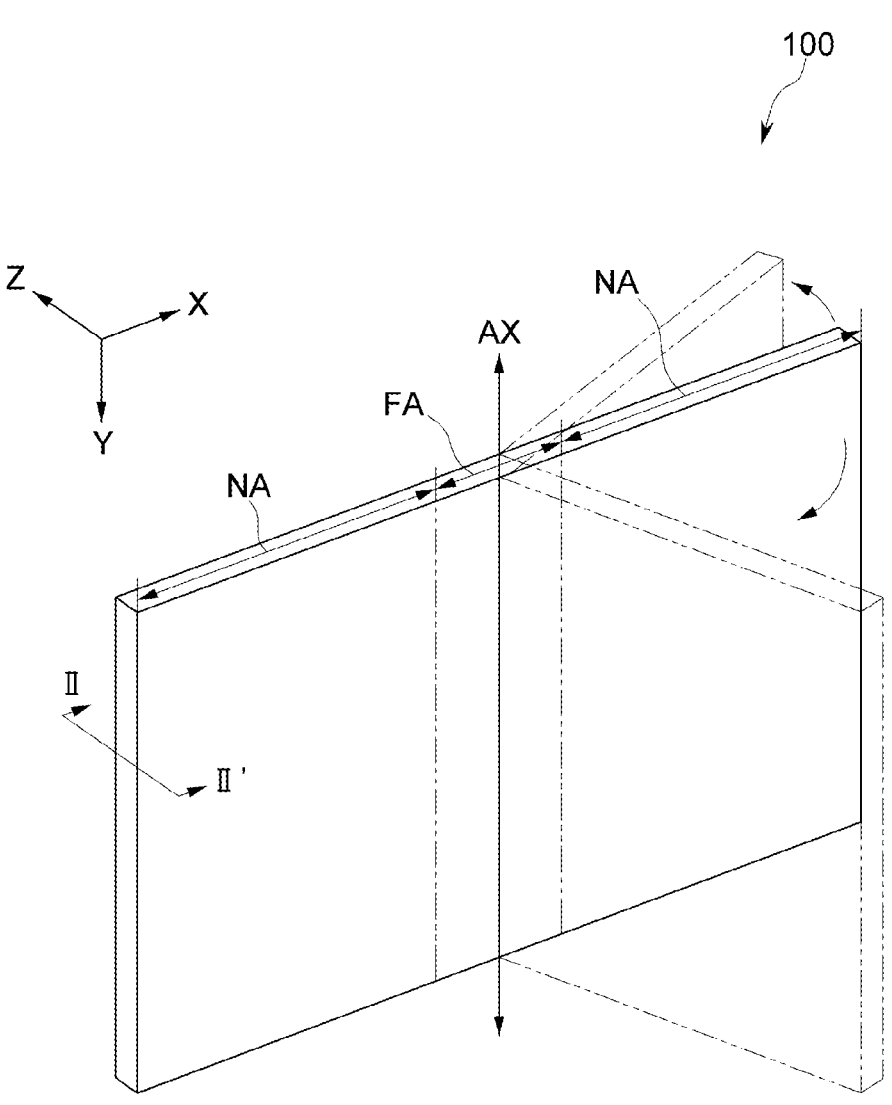
FIG. 1 is a perspective view illustrating a display device according to an embodiment.

Embodiments of the invention will now be described more fully hereinafter with reference to the accompanying drawings. Although the invention may be modified in various manners and have several embodiments, embodiments are illustrated in the accompanying drawings and will be mainly described in the specification. However, the scope of the invention is not limited to the embodiments and should be construed as including all the changes, equivalents and substitutions included in the spirit and scope according to an embodiment.

In the drawings, thicknesses of a plurality of layers and areas are illustrated in an enlarged manner for clarity and ease of description thereof. When a layer, area, or plate is referred to as being "on" another layer, area, or plate, it may be directly on the other layer, area, or plate, or intervening layers, areas, or plates may be present therebetween. Conversely, when a layer, area, or plate is referred to as being "directly on" another layer, area, or plate, intervening layers, areas, or plates may be absent therebetween. Further when a layer, area, or plate is referred to as being "below" another layer, area, or plate, it may be directly below the other layer, area, or plate, or intervening layers, areas, or plates may be present therebetween. Conversely, when a layer, area, or plate is referred to as being "directly below" another layer, area, or plate, intervening layers, areas, or plates may be absent therebetween.

The spatially relative terms "below", "beneath", "lower", "above", "upper" and the like, may be used herein for ease of description to describe the relations between one element or component and another element or component as illustrated in the drawings. It will be understood that the spatially relative terms are intended to encompass different orientations of the device in use or operation, in addition to the orientation illustrated in the drawings. For example, in the case where a device illustrated in the drawing is turned over, the device located "below" or "beneath" another device may be placed "above" another device. Accordingly, the illustrative term "below" may include both the lower and upper positions. The device may also be oriented in the other direction and thus the spatially relative terms may be interpreted differently depending on the orientations.

Throughout the specification, when an element is referred to as being "connected" to another element, the element is "directly connected" to the other element, or "electrically connected" to the other element with one or more intervening elements interposed therebetween. It will be understood that when an element is referred to as being "on" another element, it can be directly on the other element or intervening elements may be present therebetween. In contrast, when an element is referred to as being "directly on" another element, there are no intervening elements present.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." "At least one of A and B" means "A and/or B." As used herein, the term "and/or" includes any and all combinations of one or more of the associated listed items. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

It will be understood that, although the terms "first," "second," "third," and the like may be used herein to describe various elements, these elements should not be limited by these terms. These terms are only used to distinguish one element from another element. Accordingly, "a first element" discussed below could be termed "a second element" or "a third element," and "a second element" and "a third element" may be termed likewise without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined at the specification.

Some of the parts which are not associated with the description may not be provided in order to specifically describe embodiments according to an embodiment and like reference numerals refer to like elements throughout the specification.

Hereinafter, embodiments of a display device according to the invention will be described with reference to the accompanying drawings.

Figure 2:
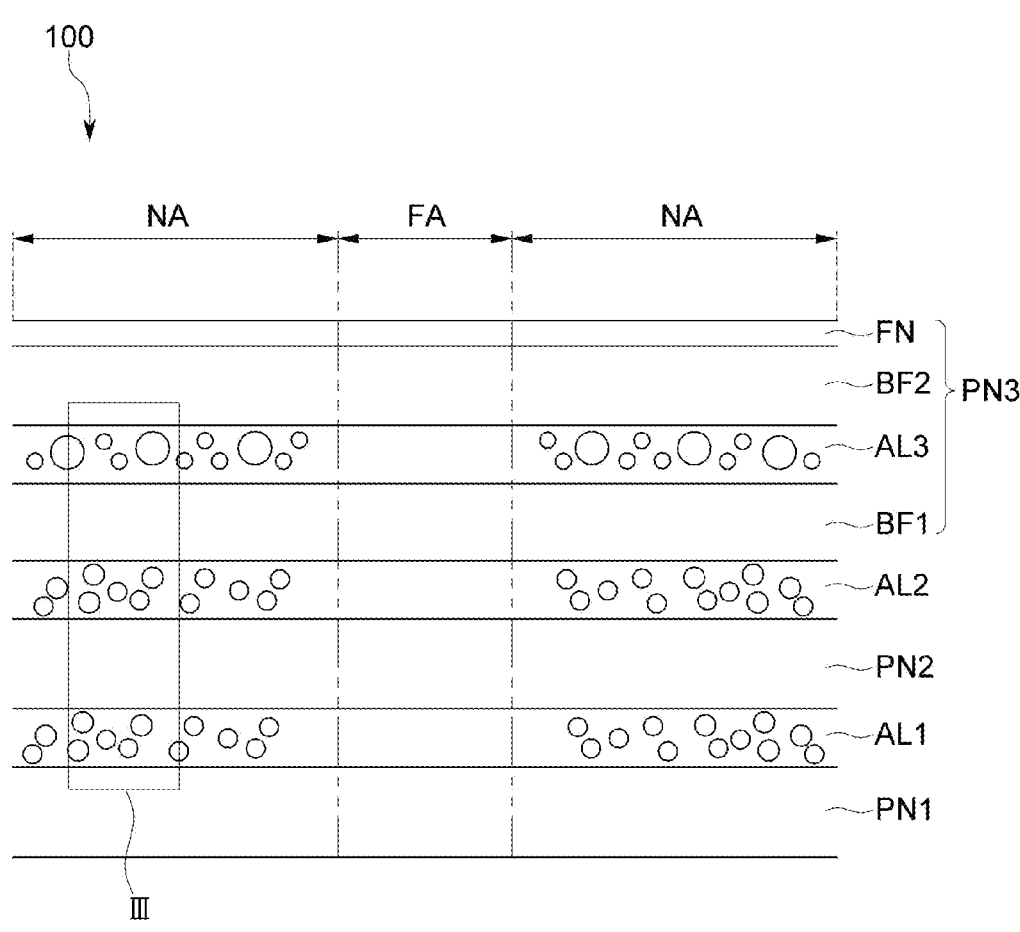
FIG. 2 is a cross-sectional view taken along line II-IP of FIG. 1.

FIG. 1 is a perspective view illustrating a display device according to an embodiment and FIG. 2 is a cross-sectional view taken along line II-IF of FIG. 1.

Referring to FIG. 1, an embodiment of a display device 100 may be a foldable display device that has flexibility and is foldable about an axis thereof, which is defined as a folding axis AX.

In an embodiment of the display device 100 where the folding axis AX is defined therein, an area that is adjacent to the folding axis AX and is directly subjected to deformation is defined as a folding area FA, and a remaining area except the folding area FA is defined as a non-folding area NA. In an embodiment, as illustrated in FIG. 1, the folding axis AX may be set to a position crossing a center portion of the display device 100 in a vertical direction with reference to FIG. 1, and thus, one folding area FA neighboring the folding axis AX, and two non-folding areas NA neighboring the folding area FA are defined.

However, the scope of the invention is not limited thereto, and the position and number of the folding axis AX, and the position and disposition of the folding area FA and the non-folding area NA may be variously modified according to a specific display device. In embodiments, the folding axis may be located on the left side or the right side of the position of folding axis AX in FIG. 1, may be set in a horizontal direction of FIG. 1 (X axis direction or a length direction) instead of the vertical direction of FIG. 1 (Y-axis direction or a width direction), and two folding axes that cross each other may be set. Herein, Z-axis direction may be a thickness direction perpendicular to X-axis direction and Y-axis direction.

Referring to FIG. 2, an embodiment of the display device 100 includes a first panel PN1, a second panel PN2, a third panel PN3, a first adhesive layer AL1, a second adhesive layer AL2, and a first base film BF1.

The first panel PN1 is located at a lowermost end portion of the display device 100, the second panel PN2 is located on the first panel PN1, and the third panel PN3 is located on the second panel PN2.

The first adhesive layer AL1 is located between the first panel PN1 and the second panel PN2 to attach the first panel PN1 and the second panel PN2 to each other, and the second adhesive layer AL2 is located between the second panel PN2 and the third panel PN3 to attach the second panel PN2 and the third panel PN3 to each other.

Each of the first panel PN1, the second panel PN2, the third panel PN3, the first adhesive layer AL1, and the second adhesive layer AL2 is defined with a folding area FA and a non-folding area NA that neighbors the folding area FA, with respect to the folding axis AX, as illustrated in FIG. 2.

The first panel PN1 may be a display panel at which a thin film transistor (not illustrated), an organic light emitting layer (not illustrated), an electrode layer (not illustrated), and an encapsulation layer (not illustrated) are sequentially stacked on one another, and the second panel PN2 may be a polarization panel including a linear polarization layer. The first panel PN1 and the second panel PN2 may include an insulating base substrate (not illustrated) including a glass, quartz, a ceramic, a metal, a plastic, or the like. In an embodiment, where the base substrate (not illustrated) includes a plastic, such as polyimide ("PI"), each panel may have flexibility to be flexible, stretchable or rollable.

In an embodiment, the first adhesive layer AL1 and the second adhesive layer AL2 may be any one of an optical clear resin ("OCR") or a pressure sensitive adhesive ("PSA"). In such an embodiment, both OCR and PSA are highly elastic, such that both of the first adhesive layer AL1 and the second adhesive layer AL2 have flexibility.

The third panel PN3 may be directly exposed to an outside, and may be a window substrate that protects the first panel PN1 and the second panel PN2 located below the third panel PN3. The third panel PN3 may include a first base film BF1, a second base film BF2, a functional layer FN, and a third adhesive layer AL3.

The first base film BF1 may be disposed or stacked on the second adhesive layer AL2. The third adhesive layer AL3, the second base film BF2 and the functional layer FN are sequentially stacked on the first base film BF1.

Each of the first base film BF1 and the second base film BF2 may include, for example, a plastic, and thus may have flexibility. The first base film BF1 and the second base film BF2 may include at least one of polyethylene terephthalate ("PET"), polycarbonate ("PC"), PI, and polymethyl methacrylate ("PMMA"). The first base film BF1 and the second base film BF2 may include substantially a same kind of plastic as each other, or different kinds of plastic from each other. However, the scope of the invention is not limited thereto, and a structure in which a multi-layer base film is stacked by an adhesive layer may be employed.

The functional layer FN is attached on the second base film BF2 to protect an upper portion of the third panel PN3 from external scratches and pressures. The functional layer FN may include at least one of a hard coating film, an anti-fingerprint film, an anti-reflection film, and an anti-glare film.

The third adhesive layer AL3 may be one of an OCR or a PSA), and the third adhesive layer AL3 may also have flexibility, similar to the first adhesive layer AL1 and the second adhesive layer AL2.

In an embodiment, where a base of the third panel PN3 has a multi-layered structure including the first base film BF1 and the second base film BF2, a deformation ratio, due to a folding stress, of the adhesive layer to an entire window substrate is reduced compared to a conventional window substrate that is typically defined by a single base film, and thus hardness of the window substrate may be improved. In such an embodiment, as compared to a method of simply thickening the base, the hardness of the window substrate may be improved without lowering the flexibility of the entire window substrate.

Hereinafter, configuration and disposition of a first reinforcement material RF1 and a second reinforcement material RF2 of the display device 100 according to an embodiment will be described in detail with reference to FIG. 3.

Figure 3:
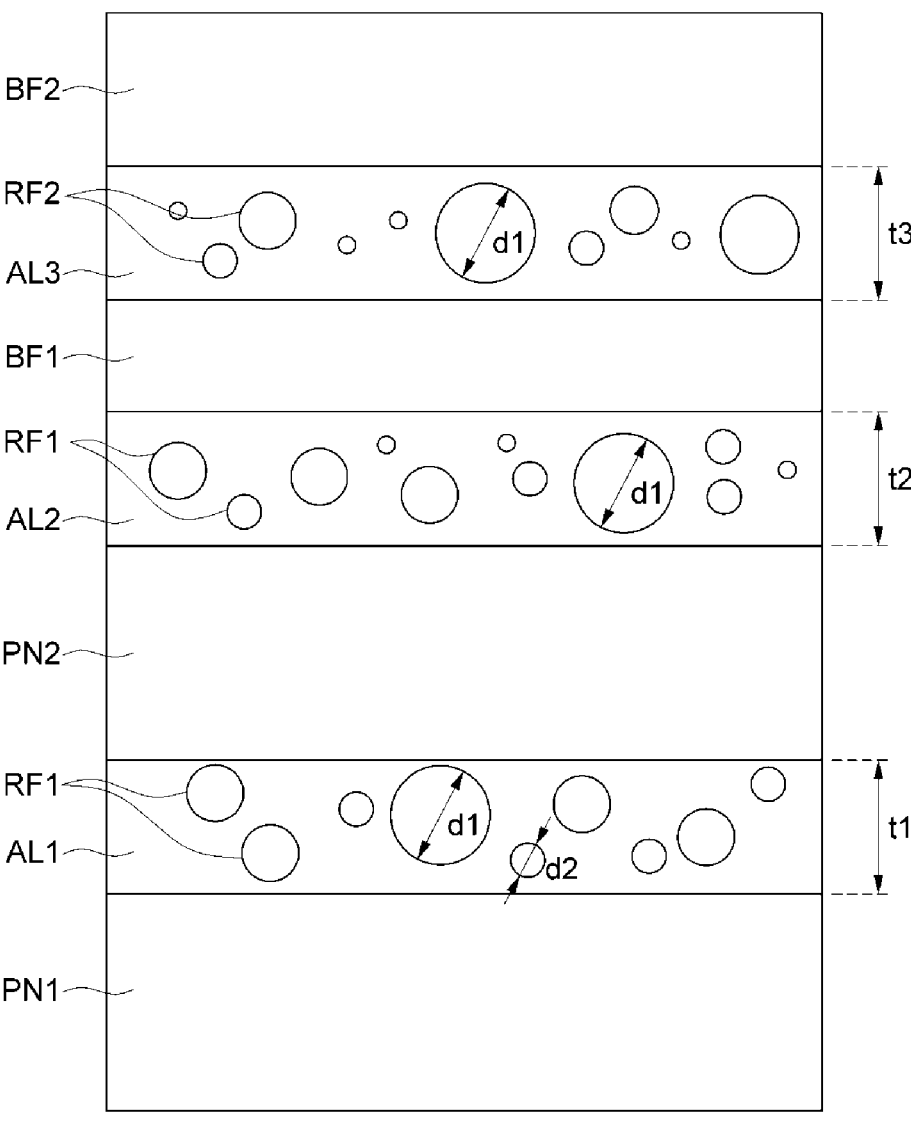
FIG. 3 is an enlarged view part of the portion III of FIG. 2.

FIG. 3 is an enlarged view of the portion III of FIG. 2.

In an embodiment, as shown in FIG. 3, the first reinforcement material RF1 may be disposed in the non-folding area NA of at least one of the first adhesive layer AL1 or the second adhesive layer AL2. In such an embodiment, the first reinforcement material RF1 may be disposed in each of the first adhesive layer AL1 and the second adhesive layer AL2, and the first reinforcement material RF1 may be disposed in only one of the first adhesive layer AL1 and the second adhesive layer AL2.

In an embodiment, the first reinforcement material RF1 may be a plurality of transparent silicon beads, as illustrated in FIG. 3. In such an embodiment, outer diameters d1 and d2 of the transparent silicon beads in a same adhesive layer may be different from each other, as illustrated in FIG. 3.

In such an embodiment, the visibility of the display device may be maintained by transparently forming the first reinforcement material RF1. In such an embodiment, by disposing the transparent silicon beads having different outer diameters, hardness of the non-folding area NA of the first adhesive layer AL1 or the second adhesive layer AL2 that includes the first reinforcement material RF1 may be effectively adjusted.

Each of the outer diameters d1 and d2 of the transparent silicon beads may be less than a thickness t1 or t2 of the adhesive layer including the transparent silicon beads. In an embodiment, the outer diameter of the transparent silicon bead or the thickness of the adhesive layer may be adjusted in a way such that the outer diameter of the transparent silicon bead is in a range from about 1% to about 95% of the thickness of the adhesive layer including the transparent silicon beads.

In such an embodiment, where the transparent silicon beads have the outer diameter less than the thickness of the adhesive layer, the transparent silicon beads may be substantially prevented from protruding outside the adhesive layer and colliding with the neighboring first and second panels PN1 and PN2.

The second reinforcement material RF2 may be disposed in the non-folding area NA of the third adhesive layer AL3. The second reinforcement material RF2 may be a plurality of transparent silicon beads that are substantially the same as the first reinforcement material RF1 described above. The outer diameters d1 and d2 of the transparent silicon beads in the non-folding area NA of the third adhesive layer AL3 may be less than a thickness t3 of the third adhesive layer AL3. In such an embodiment, by further disposing the second reinforcement material RF2 at the third adhesive layer AL3, the hardness of the adhesive layer inside the window substrate that includes two or more base films may be effectively adjusted.

Hereinafter, for convenience of description, an embodiment where the first panel PN1 is a display panel, the second panel PN2 is a polarization film, and the third panel PN3 is a window substrate will be described in detail.

Figure 4:
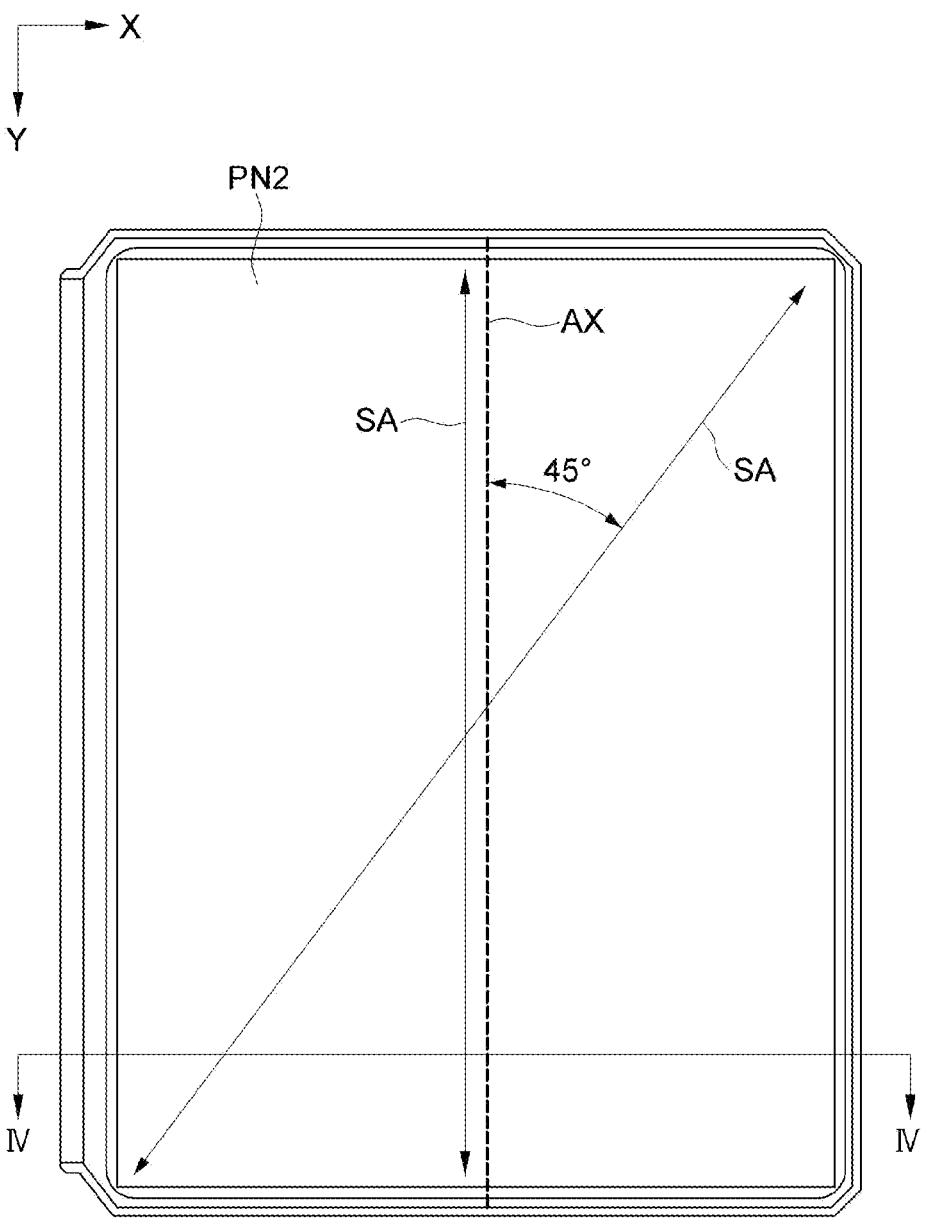
FIG. 4 is a view illustrating a polarization film having a stretched axis according to an embodiment.

FIG. 4 is a view illustrating a polarization film having a stretched axis according to an embodiment.

Referring to FIG. 4, the polarization film PN2 has a stretched axis SA. In one embodiment, for example, the polarization film PN2, including, e.g., a polyvinyl alcohol ("PVA") film, is immersed in a solution of iodine and dichroic dye, and then the polarization film PN2 is stretched in a way such that the iodine molecules and the dye molecules are aligned parallelly in the stretching direction to obtain the stretched axis SA.

In such an embodiment, light vibrating (or polarized) in the stretching direction of the polarization film PN2 is absorbed, and light vibrating in a vertical direction is transmitted through the polarization film PN2.

Accordingly, the polarization film PN2 transmits only the light, vibrating in a direction substantially the same as a light transmission axis, among the incident light, and absorbs or reflects light vibrating in the remaining directions. In such an embodiment, the light transmission axis is perpendicular to the stretched axis SA.

In an embodiment, as shown in FIG. 4, the stretched axis SA forms an angle of less than about 45° with the folding axis AX. Alternatively, the stretched axis SA may be parallel to the folding axis AX.

The polarization film PN2 may include any one of PVA, PC, polystyrene, and polymethacrylate.

When light is introduced into the display device 100 from an outside, the external light is in a state of being circularly polarized. The circularly polarized light introduced from the outside becomes a light polarized in one direction while passing through the polarization film PN2.

Figure 5:
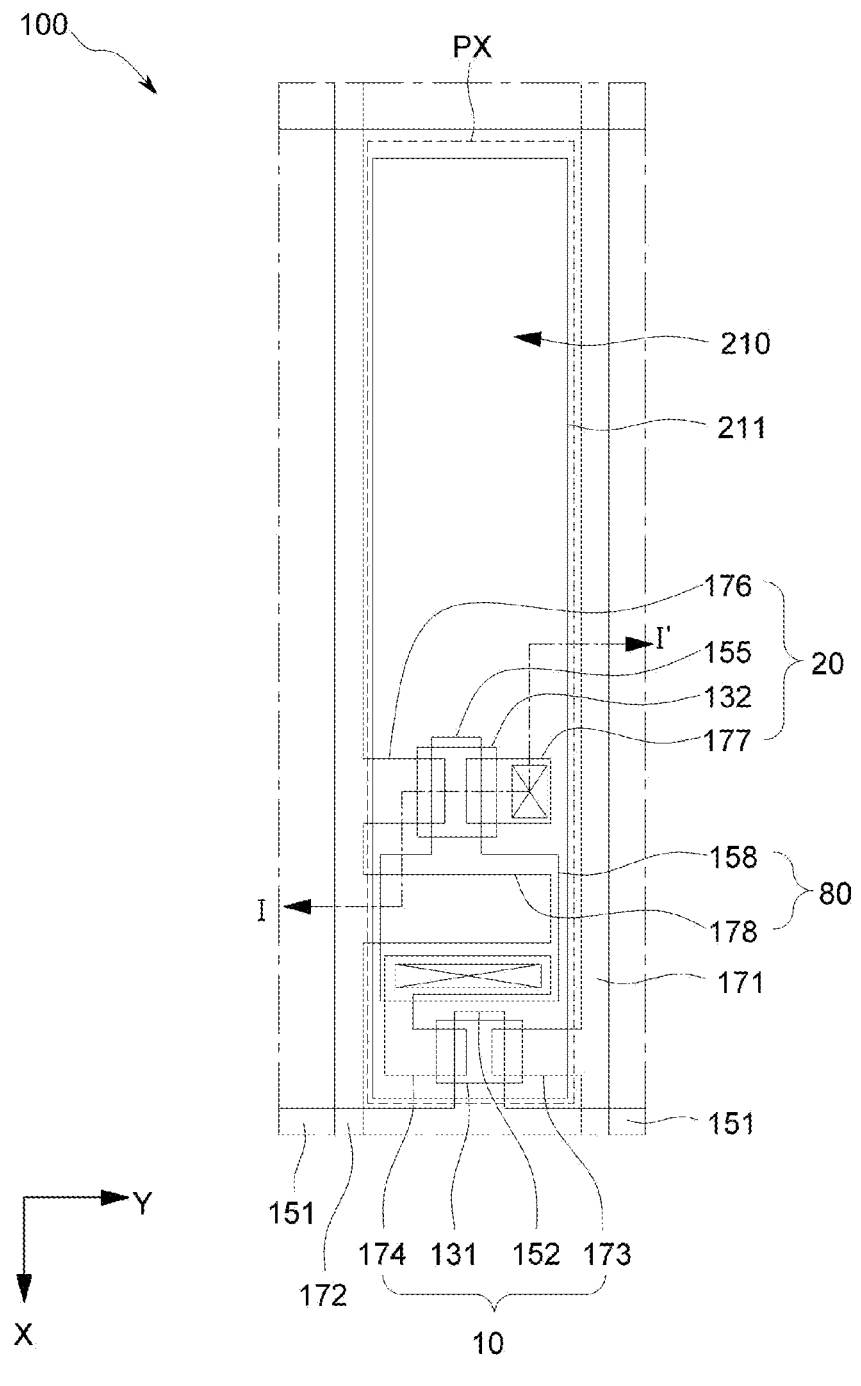
FIG. 5 is a plan view illustrating one pixel included in a display panel of FIG. 1.
Figure 6:
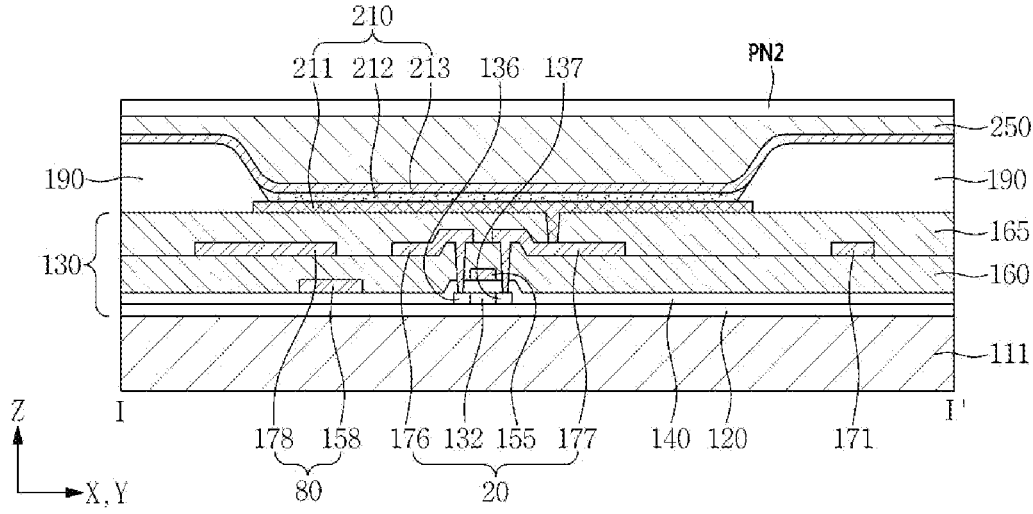
FIG. 6 is a cross-sectional view taken along line I-I' of FIG. 5.

FIG. 5 is a plan view illustrating one pixel included in a display panel of FIG. 1, and FIG. 6 is a cross-sectional view taken along line I-I' of FIG. 5.

In an embodiment, as illustrated in FIGS. 5 and 6, a pixel PX includes a light emitting element 210 and a pixel circuit unit 130.

The pixel circuit unit 130 includes a switching thin film transistor 10, a driving thin film transistor 20, and a capacitor 80.

The pixel PX may be located at an area (pixel area) defined by a gate line 151, a data line 171, and a common power line 172.

The pixel PX includes the light emitting element 210 and the pixel circuit unit 130 for driving the light emitting element 210.

The light emitting element 210 may include a pixel electrode 211, the light emitting layer 212, and a common electrode 213. In such an embodiment, the light emitting element 210 may be an organic light emitting element.

The pixel circuit unit 130 is located on a base layer 111. In other words, the switching thin film transistor 10, the driving thin film transistor 20, and the capacitor 80 are located on the base layer 111. The pixel circuit unit 130 drives the light emitting layer 212 of the light emitting element 210.

Although FIGS. 5 and 6 illustrates specific structures of an embodiment of a pixel PX including the pixel circuit unit 130 and the light emitting element 210, embodiments of the invention are not limited to the structures illustrated in FIGS. 5 and 6. The pixel circuit unit 130 and the light emitting element 210 may be formed in various structures within a range that may be easily modified by those skilled in the art.

Referring to FIG. 5, an embodiment of a pixel PX includes two thin film transistors ("TFT"s) and a single capacitor, but embodiments are not limited thereto. In an alternative embodiment, one pixel PX may include three or more thin film transistors and two or more capacitors, and may have various structures including additional signal lines.

The pixel PX refers to a minimum or basic unit for displaying an image, and may be any one of a red pixel that emits red light, a green pixel that emits green light, and a blue pixel that emits blue light.

The base layer 111 may be a transparent insulating layer including, for example, a glass or a transparent plastic. In one embodiment, for example, the base layer 111 may include one of: kapton, polyethersulphone ("PES"), PC, PI, PET, polyethylene naphthalate ("PEN"), polyacrylate ("PAR"), fiber reinforced plastic ("FRP"), and the like.

A buffer layer 120 is disposed on the base layer 111. The buffer layer 120 serves to prevent infiltration of undesirable elements and to planarize a surface therebelow and may include suitable materials for planarizing and/or preventing infiltration. In one embodiment, for example, the buffer layer 120 may include one of: a silicon nitride ($SiN_x$) layer, a silicon oxide ($SiO_2$) layer and a silicon oxynitride ($SiO_xN_y$) layer. Alternatively, the buffer layer 120 may be omitted depending on the kinds of the base layer 111 and process conditions thereof.

A switching semiconductor layer 131 and a driving semiconductor layer 132 are disposed on the buffer layer 120. The switching semiconductor layer 131 and the driving semiconductor layer 132 may include at least one of: a polycrystalline silicon layer, an amorphous silicon layer and an oxide semiconductor such as indium gallium zinc oxide (IGZO) and indium zinc tin oxide ("IZTO"). In one embodiment, for example, where the driving semiconductor layer 132 illustrated in FIG. 6 includes a polycrystalline silicon layer, the driving semiconductor layer 132 includes a channel area which is not doped with impurities, and p+ doped source and drain areas which are formed on opposite sides of the channel area. In such an embodiment, p-type impurities, such as boron B, may be used as dopant ions and $B_2H_6$ is typically used. Such impurities may vary depending on the kinds of thin film transistors.

In an embodiment, the driving thin film transistor 20 employs a p-channel metal oxide semiconductor ("PMOS") thin film transistor including p-type impurities, but embodiments are not limited thereto. Alternatively, the driving thin film transistor 20 may employ an n-channel metal oxide semiconductor ("NMOS") thin film transistor or a complementary metal oxide semiconductor ("CMOS") thin film transistor.

A gate insulating layer 140 is disposed on the switching semiconductor layer 131 and the driving semiconductor layer 132. The gate insulating layer 140 may include at least one of tetraethylorthosilicate ("TEOS"), silicon nitride ($SiN_x$) and silicon oxide ($SiO_2$). In one embodiment, for example, the gate insulating layer 140 may have a double-layer structure in which a $SiN_x$ layer having a thickness of about 40 nanometers (nm) and a TEOS layer having a thickness of about 20 nm are sequentially stacked on one another.

A gate wiring, which includes gate electrodes 152 and 155, is disposed on the gate insulating layer 140. The gate wiring further includes the gate line 151, a first capacitor plate 158, and other signal lines. In such an embodiment, the gate electrodes 152 and 155 are disposed to overlap at least a part or all of the semiconductor layers 131 and 132, or to overlap a channel area of the semiconductor layers 131 and 132. The gate electrodes 152 and 155 serve to substantially prevent impurities from being doped into the channel area, when a source area 136 and a drain area 137 of the semiconductor layer 131 and 132 are doped with impurities.

The gate electrodes 152 and 155 and the first capacitor plate 158 are disposed in a substantially same layer and include a substantially same metal material as each other. The gate electrodes 152 and 155 and the first capacitor plate 158 may include at least one of molybdenum (Mo), chromium (Cr), and tungsten (W), for example.

An insulating interlayer 160 is disposed on the gate insulating layer 140 to cover the gate electrodes 152 and 155. The insulating interlayer 160 may include or be formed of silicon nitride ($SiN_x$), silicon oxide ($SiO_x$), TEOS, or the like, similar to the gate insulating layer 140, but embodiments are not limited thereto.

A data wiring which includes source electrodes 173 and 176 and drain electrodes 174 and 177 is disposed on the insulating interlayer 160. The data wiring further includes the data line 171, the common power line 172, a second capacitor plate 178, and other wirings. In such an embodiment, the source electrodes 173 and 176 and the drain electrodes 174 and 177 are connected to the source area 136 and the drain area 137 of the semiconductor layers 131 and 132, respectively, through contact holes defined through the gate insulating layer 140 and the insulating interlayer 160.

In such an embodiment, the switching thin film transistor 10 includes the switching semiconductor layer 131, the switching gate electrode 152, the switching source electrode 173, and the switching drain electrode 174, and the driving thin film transistor 20 includes the driving semiconductor layer 132, the driving gate electrode 155, the driving source electrode 176, and the driving drain electrode 177. However, configurations of the thin film transistors 10 and 20 are not limited thereto, and thus may be modified into various structures that are easily conceived by those skilled in the pertinent art.

The capacitor 80 includes the first capacitor plate 158 and the second capacitor plate 178 with the insulating interlayer 160 therebetween.

The switching thin film transistor 10 functions as a switching element to select pixels to perform light emission. The switching gate electrode 152 is connected to the gate line 151. The switching source electrode 173 is connected to the data line 171. The switching drain electrode 174 is spaced apart from the switching source electrode 173 and is connected to the first capacitor plate 158.

The driving thin film transistor 20 applies, to the pixel electrode 211, a driving power which allows the light emitting layer 212 of the light emitting element 210 provided in a selected pixel to emit light. The driving gate electrode 155 is connected to the first capacitor plate 158. Each of the driving source electrode 176 and the second capacitor plate 178 is connected to the common power line 172. The driving drain electrode 177 is connected to the pixel electrode 211 of the light emitting element 210 through a contact hole.

In such an embodiment, the switching thin film transistor 10 is driven by a gate voltage applied to the gate line 151 and serves to transmit a data voltage, applied to the data line 171, to the driving thin film transistor 20. A voltage equivalent to a difference between a common voltage applied to the driving thin film transistor 20 from the common power line 172 and the data voltage transmitted from the switching thin film transistor 10 is stored in the capacitor 80, and a current corresponding to the voltage stored in the capacitor 80 flows to the light emitting element 210 through the driving thin film transistor 20, and thus the light emitting element 210 may emit light.

A planarization layer 165 is disposed to cover the data wiring, e.g., the data line 171, the common power line 172, the source electrodes 173 and 176, the drain electrodes 174 and 177, and the second capacitor plate 178, which may be patterned by a single mask or a same mask. The planarization layer 165 is located on the insulating interlayer 160.

The planarization layer 165 provides a planar surface to increase luminous efficiency of the light emitting element 210 to be located thereon. The planarization layer 165 may include at least one of a PAR resin, an epoxy resin, a phenolic resin, a polyamide resin, a PI resin, an unsaturated polyester resin, a polyphenylen-based resin, a polyphenylen ether resin, a polyphenylene sulfide resin and benzocyclobutene ("BCB").

The pixel electrode 211 of the light emitting element 210 is disposed on the planarization layer 165. The pixel electrode 211 is connected to the drain electrode 177 through a contact hole defined at the planarization layer 165.

A part or all of the pixel electrode 211 is disposed in a transmission area (or a light emission area) of the pixel PX. In such an embodiment, the pixel electrode 211 is disposed corresponding to the transmission area of the pixel which is defined by a pixel defining layer 190. The pixel defining layer 190 may include a resin based on, for example, PAR and PI.

The light emitting layer 212 is disposed on the pixel electrode 211 in the transmission area, and the common electrode 213 is disposed on the pixel defining layer 190 and the light emitting layer 212.

The light emitting layer 212 includes a low molecular organic material or a high molecular organic material. At least one of a hole injection layer and a hole transporting layer may further be disposed between the pixel electrode 211 and the light emitting layer 212, and at least one of an electron transporting layer and an electron injection layer may further be disposed between the light emitting layer 212 and the common electrode 213.

The pixel electrode 211 and the common electrode 213 may be formed as one of a transmissive electrode, a transflective electrode and a reflective electrode.

In an embodiment, transparent conductive oxide ("TCO") may be used to form a transmissive electrode. In one embodiment, for example, TCO may include at least one of indium tin oxide ("ITO"), indium zinc oxide ("IZO"), antimony tin oxide ("ATO"), aluminum zinc oxide ("AZO"), zinc oxide (ZnO), and a combination thereof.

Alternatively, a metal, e.g., magnesium (Mg), silver (Ag), gold (Au), calcium (Ca), lithium (Li), chromium (Cr), aluminum (Al), and copper (Cu), or an alloy thereof may be used to form a transflective electrode and a reflective electrode. In such an embodiment, whether an electrode is a transflective type or a reflective type depends on a thickness of the electrode. Typically, the transflective electrode has a thickness of about 200 nm or less, and the reflective electrode has a thickness of about 300 nm or greater. As the thickness of the transflective electrode decreases, light transmittance and resistance increase. On the contrary, as the thickness of the transflective electrode increases, light transmittance decreases.

In addition, the transflective electrode and the reflective electrode may have a multi-layer structure which includes a metal layer including a metal or a metal alloy and a TCO layer stacked on the metal layer.

In an embodiment, the pixel PX may have a double-sided emission type structure that emits light in the directions of the pixel electrode 211 and the common electrode 213. In such an embodiment, both the pixel electrode 211 and the common electrode 213 may be formed as transmissive or transflective electrodes.

A sealing member 250 is disposed on the common electrode 213. The sealing member 250 may include a transparent insulating substrate including a transparent glass, a plastic, or the like. In an embodiment, the sealing member 250 may have a thin film encapsulation structure including one or more inorganic layers and one or more organic layers. In such an embodiment, the one or more inorganic layers and the one or more organic layers are stacked alternately on one another.

Figure 7:
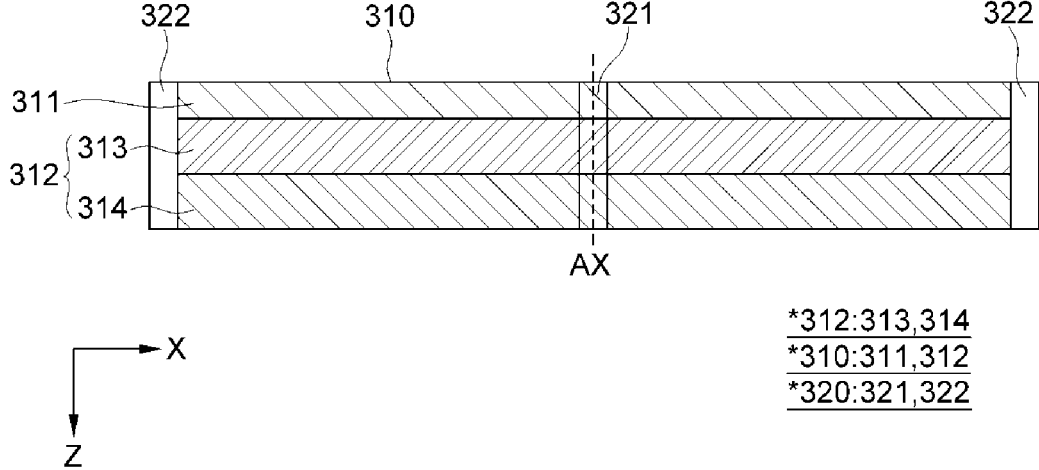
FIG. 7 is a cross-sectional view taken along line IV-IV' of FIG. 4 according to an embodiment.

FIG. 7 is a cross-sectional view taken along line IV-IV' of FIG. 4 according to an embodiment.

Referring to FIGS. 1 to 7, an embodiment of the polarization film PN2 includes a base substrate 310 having a folding axis AX and a stretched axis SA, and a deformation portion 320 located at an edge of the base substrate 310.

In such an embodiment, the folding axis AX is substantially the same as the folding axis AX defined in the folding area FA of the display panel PN1.

The base substrate 310 includes a linear polarization layer 311 having a stretched axis and a phase retardation layer 312 disposed on the linear polarization layer 311.

The stretched axis SA forms an angle of less than about 45° with the folding axis AX. In such an embodiment, the stretched axis SA of the linear polarization layer 311 forms an angle of less than about 45° with the folding axis AX of the display panel PN1. Alternatively, the stretched axis SA may be parallel to the folding axis AX.

The linear polarization layer 311 includes a light absorption axis parallel to the stretched axis SA, and a light transmission axis perpendicular to the light absorption axis.

The light absorption axis parallel to the stretched axis SA may be parallel to the folding axis AX. Accordingly, when the stretched axis SA forms an angle of less than about 45° with the folding axis AX, the folding axis AX may forms an angle of less than about 45° with the light absorption axis.

The folding axis AX in an angle of less than about 45° with respect to the light absorption axis may form an angle of less than about 135° with the light transmission axis.

When the stretched axis SA parallel to the folding axis AX is perpendicular to the light transmission axis, the folding axis AX may also be perpendicular to the light transmission axis.

The polarization film PN2 may be disposed on the display panel PN1. In such an embodiment, the base substrate 310 of the polarization film may be attached to the sealing member 250 of the display panel PN1 by the first adhesive layer AL1. The first adhesive layer AL1 may be an OCR, a PSA, or the like.

The base substrate 310 may be disposed on a tri acetyl cellulose ("TAC") film. In one embodiment, for example, the TAC film may be attached on a phase retardation layer by the adhesive layer including PSA, and the base substrate 310 may be disposed on the TAC film.

A hard coating-tri acetyl cellulose ("HC-TAC") film may be disposed on the base substrate 310, and a protective film may be disposed on the HC-TAC film.

The linear polarization layer 311 may allow natural light or any polarized light into linearly polarized light in a specific direction, and may reduce reflection of external light.

The linear polarization layer 311 may include at least one of PVA, polycarbonate, polystyrene, and polymethacrylate.

The phase retardation layer 312 may be located on at least one surface of the linear polarization layer 311.

The phase retardation layer 312 may change a linearly polarized light into a circularly polarized light or a circularly polarized light into a linearly polarized light by delaying a phase of incident light by about $1/2\lambda$ or by about $1/4\lambda$.

The phase retardation layer 312 includes at least one of a $1/2\lambda$ phase retardation layer 313 and a $1/4\lambda$ phase retardation layer 314.

Referring to FIG. 7, an embodiment of the phase retardation layer 312 includes the $1/2\lambda$ phase retardation layer 313 and the $1/4\lambda$ phase retardation layer 314, but embodiments are not limited thereto. In an alternative embodiment, only one of the $1/2\lambda$ phase retardation layer 313 and the $1/4\lambda$ phase retardation layer 314 may be provided.

Referring to FIG. 7, the $1/2\lambda$ phase retardation layer 313 delays the phase of incident light by about $1/2\lambda$, and the $1/4\lambda$ phase retardation layer 314 delays the phase of incident light by about $1/4\lambda$.

An ultra-violet ("UV") adhesive is disposed between the $1/2\lambda$ phase retardation layer 313 and the $1/4\lambda$ retardation layer 314 such that the $1/2\lambda$ retardation layer 313 and the $1/4\lambda$ retardation layer 314 may be attached to each other by the UV adhesive.

A release film may be attached to another surface of the $1/2\lambda$ phase retardation layer 313 or the $1/4\lambda$ phase retardation layer 314 by an adhesive layer PSA.

The deformation portion 320 may be located at an edge of the base substrate 310. In an embodiment, the deformation portion 320 is disposed or defined at the edge of the base substrate 310 in a process of laser-cutting the polarization film PN2. The deformation portion 320 may have a width substantially equal to or greater than about 70 micrometers (μm) and substantially equal to or less than about 80 μm.

The deformation portion 320 has a greater width in the non-folding area NA than in the folding area FA.

The deformation portion 320 includes a first deformation portion 321 extending in a direction perpendicular to the folding axis AX on a plane or when viewed in a plan view; and a second deformation portion 322 extending in a direction parallel to the folding axis AX on a plane.

In an embodiment, the first deformation portion 321 is located or disposed at opposite edges of the polarization film PN2 that are perpendicular to the folding axis AX, and the second deformation portion 322 is located at opposite edges of the polarization film PN2 that are parallel to the folding axis AX.

The first deformation portion 321 is located at an edge of the base substrate 310 of the folding area FA at which the stretched axis SA is included, and the second deformation portion 322 is located at an edge of the base substrate 310 of the non-folding area NA.

In such an embodiment, the first deformation portion 321 is located on the stretched axis SA at an edge of the base substrate 310 of the folding area FA, or located on the edge of the base substrate 310 at the folding area FA, where the folding area FA is in a direction substantially the same as the stretched axis SA. The second deformation portion 322 is located on an edge of the base substrate 310, where the edge is in a direction substantially the same as the stretched axis SA, and the stretched axis SA is located at the folding area FA.

Accordingly, the first deformation portion 321 defined or formed at the edge of the base substrate 310 at the folding area FA, the folding area FA in a direction substantially the same as the stretched axis SA, is hardly affected by laser cutting, or less affected as compared to the second deformation portion 322.

In such an embodiment, the second deformation portion 322 defined or format the edge of the base substrate 310 of the non-folding area NA in a direction perpendicular to the stretched axis SA may be more affected by the laser cutting as compared to the first deformation portion 321.

The second deformation portion 322 has a width greater than a width of the first deformation portion 321. That is, the first deformation portion 321 has a width less than a width of the second deformation portion 322.

Figure 8A:
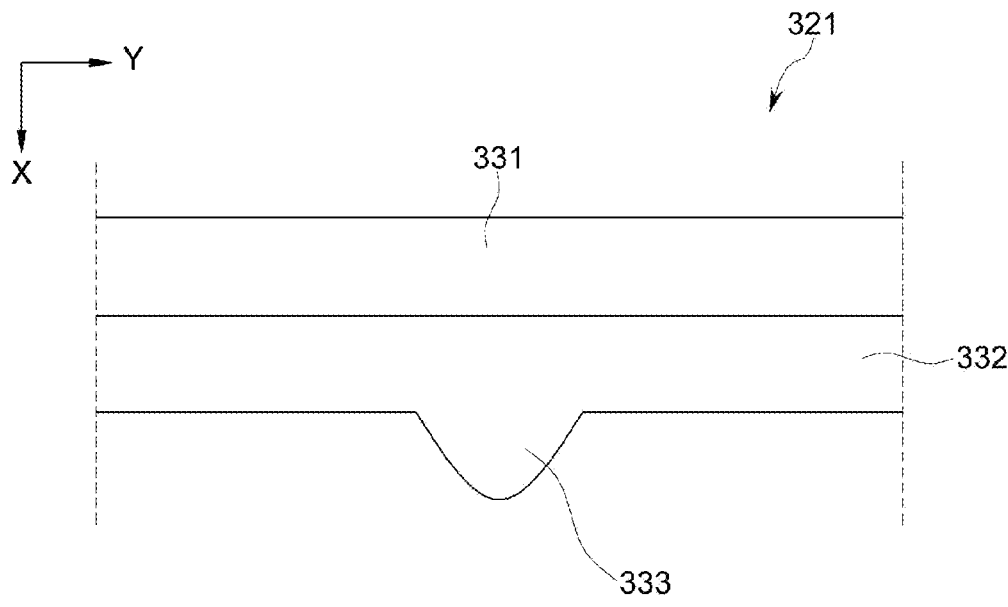
FIG. 8A is a view illustrating a structure of a first deformation portion of a polarization film according to an embodiment.
Figure 8B:
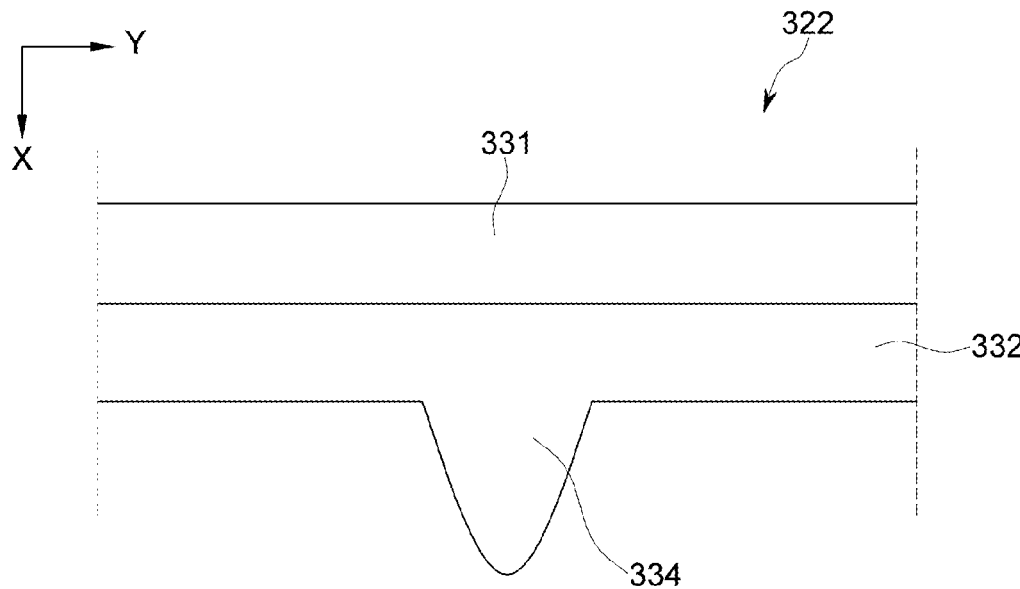
FIG. 8B is a view illustrating a structure of a second deformation portion of a polarization film according to an embodiment.

FIG. 8A is a view illustrating a structure of a first deformation portion of a polarization film according to an embodiment, and FIG. 8B is a view illustrating a structure of a second deformation portion of a polarization film according to an embodiment.

In an embodiment, as illustrated in FIG. 8A, the first deformation portion 321 includes a thermally denatured portion (i.e., heat attacked zone ("HAZ")) 331, a color shifting portion 332, and a first recessed portion 333 which are arranged on a plane from the edge of the base substrate 310 toward a center portion thereof. In an embodiment, when the first deformation portion 321 is formed during laser cutting of the polarization film PN2, the first deformation portion 321 may have a structure including the thermally denatured portion 331, the color shifting portion 332, and the first recessed portion 333, as illustrated in FIG. 8A.

The thermally denatured portion 331 may be partially carbonized by heat of laser light. The color shifting portion 332 may be shifted in terms of color to yellow or yellowish brown by heat transmitted from the thermally denatured portion 331.

The first recessed portion 333 has at least one recess located at regular intervals. The recess is defined after the iodine (I) molecules and the dye molecules aligned parallelly in the stretching direction in the linear polarization layer 311 of the base substrate 310 are vaporized by the heat of laser light, and located at corresponding position. In such an embodiment, the recess may have a cross-sectional shape of one of a semicircle, a sawtooth, a triangle, and a quadrangle, for example.

The first recessed portion 333 may have a size of less than about 30 μm.

In an embodiment, as illustrated in FIG. 8B, the second deformation portion 322 includes a thermally denatured portion (i.e., HAZ) 331, a color shifting portion 332, and a second recessed portion 334 which are arranged on a plane from the edge of the base substrate 310 toward a center portion thereof. In an embodiment, when the second deformation portion 322 is formed during laser cutting of the polarization film PN2, the second deformation portion 322 may have a structure including the thermally denatured portion 331, the color shifting portion 332, and the second recessed portion 334, as illustrated in FIG. 8B.

The second deformation portion 322 has a width greater than a width of the first deformation portion 321. The second deformation portion 322 has a width substantially equal to or greater than about 70 μm and substantially equal to or less than about 80 μm.

The second recessed portion 334 may have a size substantially equal to or greater than about 30 μm and substantially equal to or less than about 40 μm.

The second recessed portion 334 has a width greater than a width of the first recessed portion 333. That is, the first recessed portion 333 has a width less than a width of the second recessed portion 334.

The polarization film PN2 may not include the first deformation portion 321 in the folding area FA. In such an embodiment, when laser cutting the polarization film PN2, the first deformation portion 321 may not be formed at the edge of the base substrate 310 at the folding area FA, where the folding area FA is in a direction substantially the same as the stretched axis SA.

Figure 9:
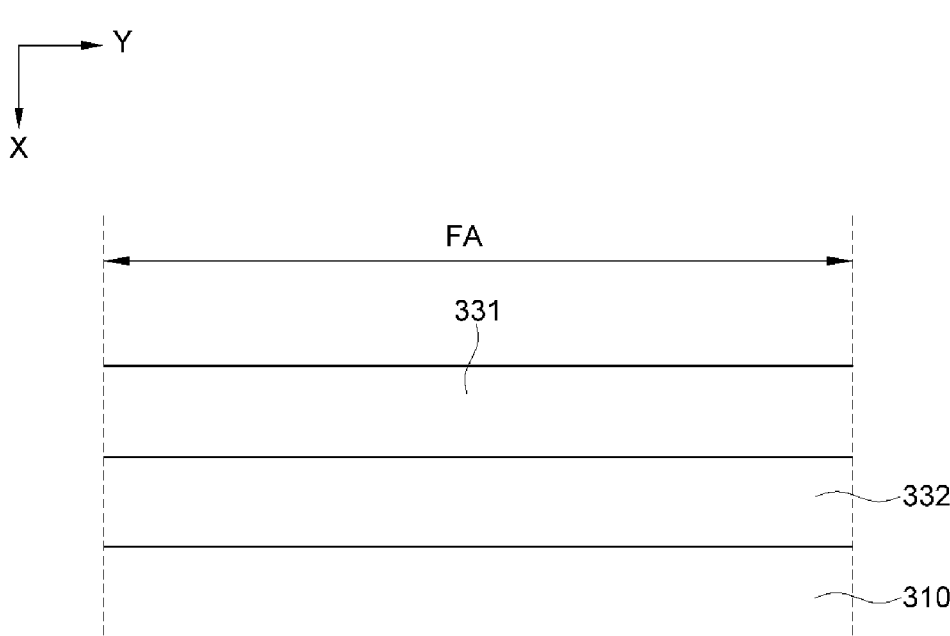
FIG. 9 is a view illustrating a state of a first deformation portion after laser cutting in a polarization film according to an embodiment.

Accordingly, the first deformation portion 321 is less affected by the heat of the laser light, as compared to the second deformation portion 322, due to the influence of the stretched axis SA, and thus, the first recessed portion 333 may not be formed at an end portion of the folding area FA, as illustrated in FIG. 9. FIG. 9 is a view illustrating a state of a first deformation portion after laser cutting in a polarization film according to an embodiment. In an embodiment, as illustrated in FIG. 9, in the first deformation portion 321, only the thermally denatured portion 331 and the color shifting portion 332 arranged on a plane from the edge of the base substrate 310 toward a center portion thereof may be formed.

Figure 10:
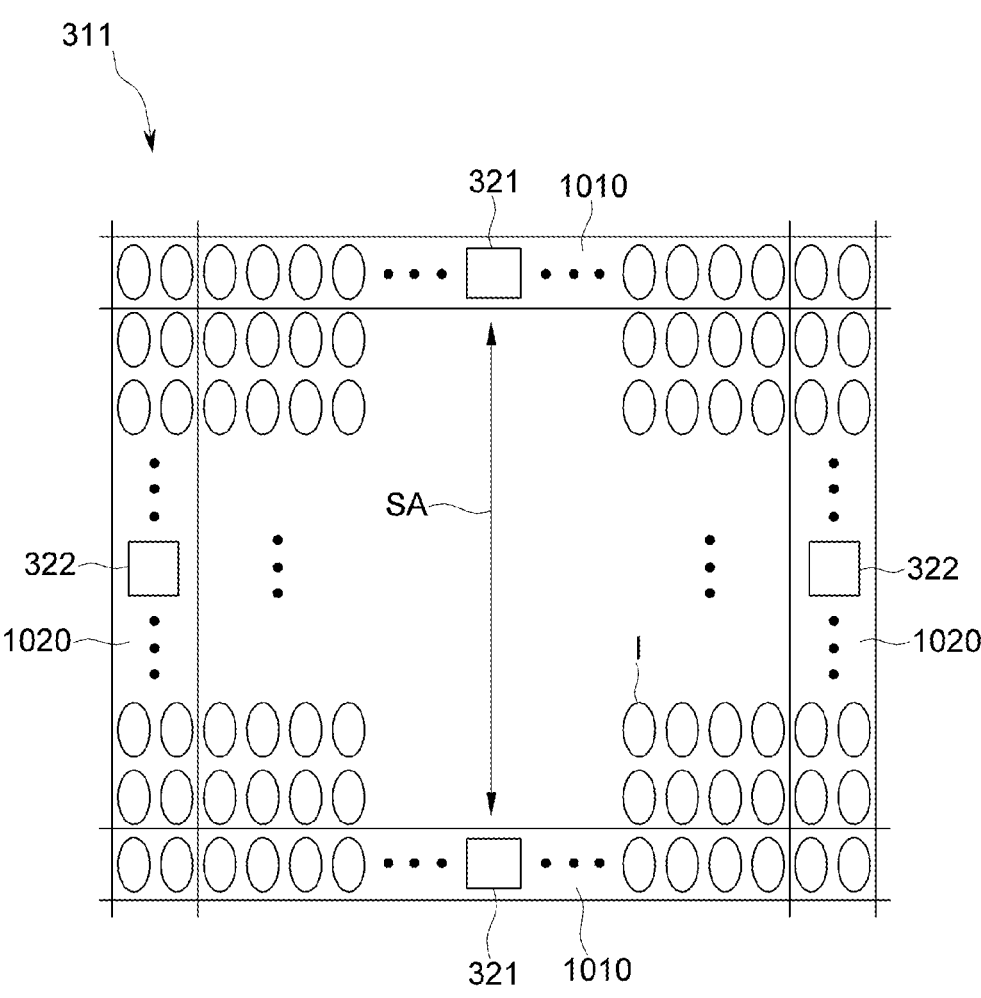
FIG. 10 is a view illustrating a range of change, according to laser light, of iodine molecules aligned in parallel with a stretched axis according to an embodiment.

FIG. 10 is a view illustrating a range of change, according to laser light, of iodine molecules aligned in parallel with a stretched axis according to an embodiment.

In an embodiment, as illustrated in FIG. 10, since the second deformation portion 322 is located at opposite edges of the base substrate 310 that are parallel to the stretched axis SA, the second deformation portions 322 is more affected by the heat of laser light as compared to the first deformation portion 321. As illustrated in FIG. 10, in the linear polarization layer 311 of the base substrate 310, including, e.g., a PVA film, is immersed in a solution of iodine and dichroic dye, and then the PVA film is stretched such that the iodine molecules and the dye molecules are arranged parallelly in the stretching direction to obtain the stretched axis SA.

The first deformation portion 321 is located at an edge of the linear polarization layer 311 including iodine molecules 1010 aligned in a direction perpendicular to the stretched axis SA, and the second deformation portion 322 is located at an edge of the linear polarization layer 311 including iodine molecules 1020 aligned in a direction parallel to the stretched axis SA.

In laser cutting of the polarization film PN2, the laser light is emitted, with a substantially same width, along the edge of the linear polarization layer 311, to the iodine molecules 1010 aligned in a direction perpendicular to the stretched axis SA, and the iodine molecules 1020 aligned in a direction parallel to the stretched axis SA.

However, although the laser beam of a substantially same width is emitted to the edge of the linear polarization layer 311, the number of the iodine molecules irradiated with the laser light is different in the first deformation portion 321 and the second deformation portion 322, according to the alignment direction with respect to the stretched axis SA.

That is, although laser light having a substantially same width is directed, the iodine molecules 1010 arranged in a direction perpendicular to the stretched axis SA are more irradiated with the laser light than the iodine molecules 1020 aligned in a direction parallel to the stretched axis SA are.

In such an embodiment, after the iodine molecules 1010 arranged in a direction perpendicular to the stretched axis SA and the iodine molecules 1020 aligned in a direction parallel to the stretched axis SA are vaporized by the laser light, the recesses are defined at each corresponding location.

In the linear polarization layer 311, in terms of a change range of the iodine molecules according to the irradiation of laser light, a change range of the iodine molecules 1020 aligned in a direction parallel to the stretched axis SA is greater than a change range of the iodine molecules 1010 arranged in a direction perpendicular to the stretched axis SA.

Accordingly, the first deformation portion 321 may have a size less than a size of the second deformation portion 322. That is, a length of the recessed portion of the second deformation portion 322 is greater than a length of the recessed portion of the first deformation portion 321, and a width of the recessed portion of the second deformation portion 322 is greater than a width of the first deformation portion 321.

Figure 11:
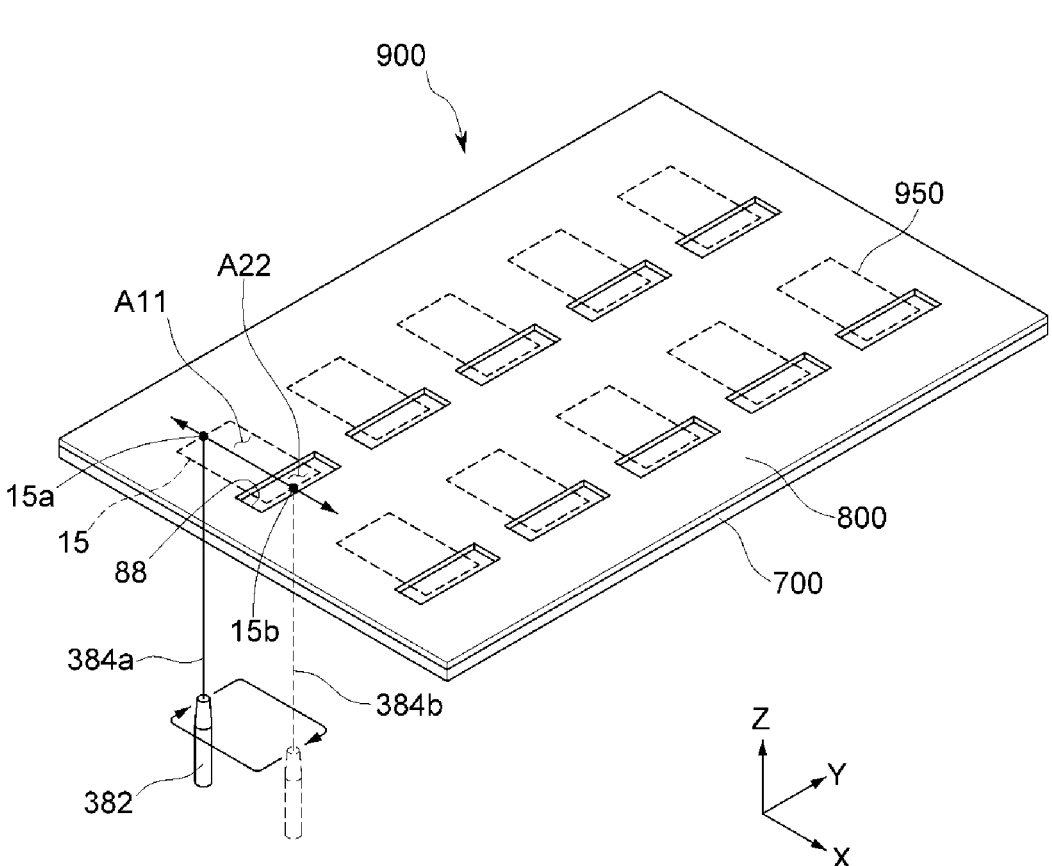
FIG. 11 is a view illustrating an embodiment of a process of obtaining unit panels by laser-cutting a mother bonding panel according to an embodiment.

FIG. 11 is a view illustrating an embodiment of a process of obtaining unit panels by laser-cutting a mother bonding panel according to an embodiment.

Referring to FIG. 11, a mother polarization plate 800 is attached on a mother panel 700.

The mother panel 700 includes a carrier layer (not illustrated) and a display panel PN1. The carrier layer includes a fourth adhesive layer (not illustrated) and a second protective layer (not illustrated) disposed below the display panel PN1. The fourth adhesive layer is located between the second protective layer and a base layer 111 of the display panel PN1.

The mother polarization plate 800 includes a first adhesive layer ALL a polarization film PN2, and a first protective layer (not illustrated), and is attached to the mother panel 700 by the first adhesive layer ALL A plurality of holes 88 is defined through the mother polarization plate 800. The plurality of holes 88 is used to align the mother panel 700 and the mother polarization plate 800 with each other. The first base film BF1 may be attached on the polarization film PN2 by a second adhesive layer AL2.

The structure in which the mother panel 700 and the mother polarization plate 800 are bonded to each other is defined as a mother bonding panel 900.

In an embodiment, as illustrated in FIG. 11, a division process of dividing the mother bonding panel 900 into a plurality of unit panels is performed. In such an embodiment, the mother bonding panel 900 is cut by laser lights 384a and 384b from a laser equipment 382. A UV picosecond laser equipment may be used as the laser equipment 382.

In such an embodiment, as illustrated in FIG. 11, the laser lights 384a and 384b are emitted in a Z-axis direction (or a thickness direction of the mother bonding panel 900) from below the mother bonding panel 900 toward the mother bonding panel 900. Accordingly, the laser lights 384a and 384b emitted to the mother bonding panel 900 pass through the mother panel 700 first, and then through the mother polarization plate 800.

In such an embodiment, as illustrated in FIG. 11, the laser light 384a and 384b emitted to the mother bonding panel 900 moves along a closed-loop cutting line (hereinafter, "first cutting line") 15 enclosing a first area A11 and a second area A22 that are adjacent to each other. Accordingly, a portion enclosed by the first cutting line 15 is separated from the mother bonding panel 900. In such an embodiment, the portion separated from the mother bonding panel 900 is defined as a unit panel 950.

Through this division process, a plurality of unit panels 950 are obtained from a single mother bonding panel 900.

The laser light 384a (hereinafter, "first laser light") emitted to a first partial cutting line 15a may have an intensity stronger than an intensity of the laser light 384b (hereinafter, "second laser light") emitted to a second partial cutting line 15b. In such an embodiment, the first laser light 384a having a relatively stronger intensity may be emitted along the first partial cutting line 15a of the mother bonding panel 900, and the second laser light 384b having a relatively weaker intensity may be emitted along the second partial cutting line 15b of the mother bonding panel 900. In one embodiment, for example, when the UV pico-second laser equipment is used as the above-described laser equipment 382, the first laser light 384a may be emitted with a power in a range from about 15 watts (W) to about 25 W, while the second laser light 384b may be emitted with a power in a range from about 3 W to about 10 W.

In such an embodiment, each of the first laser light 384a and the second laser light 384b is emitted in a pulse scheme which has a frequency of about 400 hertz (Hz). A pulse width (pulse duration) of this pulse may be about 15 picoseconds (ps). In an embodiment, each of the first laser light 384a and the second laser light 384b may have a substantially same beam width of a spot size of about 22 μm. In addition, the laser equipment 382 may vary the intensity of laser light while maintaining a laser scanning speed at, for example, about 3,000 millimeters per second (mm/s).

A length of an end portion of the unit panel 950 varies according to the intensity of the laser light. In other words, an end portion of the unit panel 950 cut by the first laser light 384a having a strong intensity may have a length longer than a length of an end portion of the unit panel 950 cut by the second laser light 384b having a weak intensity.

In an embodiment, although the structure in which the first base film BF1 is attached on the polarization film PN2 by the second adhesive layer AL2 is illustrated, instead of the first base film BF1, a protective film PF including acryl may be attached to polarization film PN2. During laser cutting the polarization film PN2, to which the protective film of the acrylic material is attached, the acrylic material may be broken or damaged by the heat of laser light. Accordingly, an area to which the protective film of the acrylic material is attached may be irradiated with a laser light of a low output so that the intensity of laser light is at a predetermined level or less, thereby preventing the polarization film PN2 from being damaged.

Figure 12:
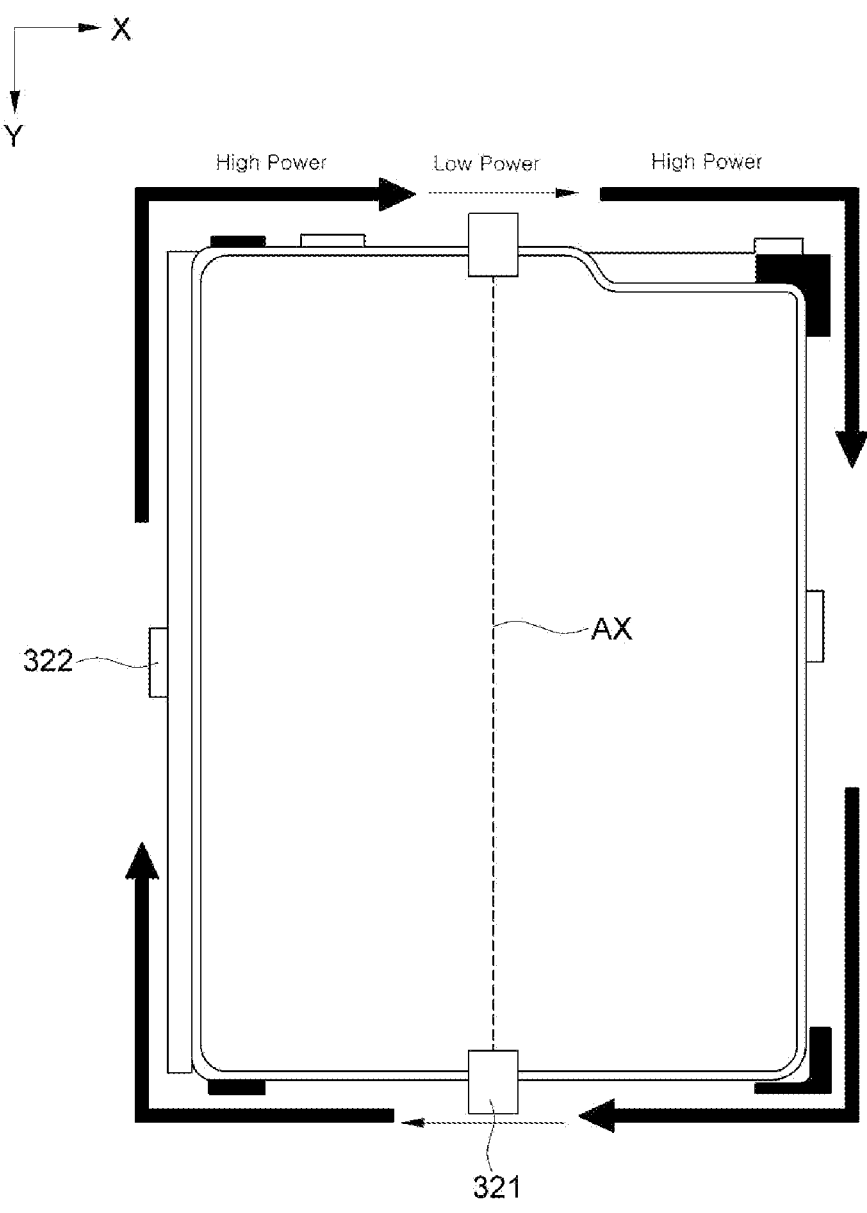
FIG. 12 is a view illustrating a case in which an intensity of laser light varies for each area according to an embodiment.

FIG. 12 is a view illustrating a case in which an intensity of laser light varies for each area according to an embodiment.

Referring to FIGS. 1 to 12, the intensity of laser light during laser cutting of the polarization film PN2 is substantially equal to or less than a predetermined level only in the folding area FA, than the intensity of laser light in the non-folding area NA.

In one embodiment, for example, as illustrated in FIG. 12, the laser equipment 382 may output low-power laser light in the folding area FA having the folding axis AX, and output high-power laser light in other areas.

In such an embodiment, crack may be effective prevented from occurring in the folding area FA by reducing the intensity of laser light to about half or less than the intensity of laser light in other areas.

Accordingly, the first recessed portion 333 is not formed at the first deformation portion 321 which is located at the edge of the base substrate 310 at the folding area FA of the polarization film PN2, as illustrated in FIG. 9. As illustrated in FIG. 9, only the thermally denatured portion 331 and the color shifting portion 332 may be formed at the edge of the folding area FA of the base substrate 310 in the first deformation portion 321.

In an embodiment, in the polarization film PN2, a first crack including the thermally denatured portion 331, the color shifting portion 332 and the recessed portion 333 may occur, after laser cutting, in the first deformation portion 321 which extends in a direction perpendicular to the folding axis AX. That is, the first crack may occur in the first deformation portion 321 located at the edge of the base substrate 310 in the folding area FA of the polarization film PN2 through a process as illustrated in FIG. 10.

In such an embodiment, recesses having a size of less than about 30 μm in an X direction may be generated in the recessed portion 333, illustrated in FIG. 8, in the first deformation portion 321.

In an embodiment, a second crack including the thermally denatured portion 331, the color shifting portion 332, and the recessed portion 333 may occur, after laser cutting, in the second deformation portion 322 which extends in a direction parallel to the folding axis AX. That is, the second crack may occur in the second deformation portion 322 located at the edge of the base substrate 310 in the non-folding area NA of the polarization film PN2 through a process as illustrated in FIG. 10.

In such an embodiment, recesses having a size substantially equal to or greater than about 30 μm and substantially equal to or less than about 40 μm may be formed in the recessed portion 333 in the second deformation portion 322. In one embodiment, for example, the recessed portion 333 may have a recess having a size of about 35 μm in the X direction, as illustrated in FIG. 8, and in such case, a size from the thermally denaturation portion 331, through the color shifting portion 332, to the recessed portion 333 in the X direction may be substantially equal to or greater than about 70 μm and substantially equal to or less than about 80 μm.

In an embodiment, a length of the recessed portion of the second deformation portion 322 is greater than a length of the recessed portion of the first deformation portion 321, and a width of the recessed portion of the second deformation portion 322 is greater than a width of the recessed portion of the first deformation portion 321.

Figure 13:
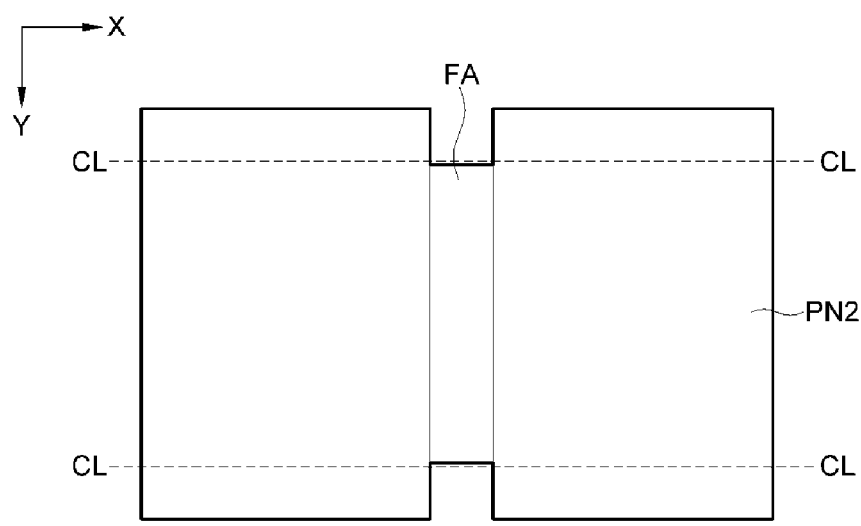
FIG. 13 is a view illustrating a polarization film having a less width at a folding area according to an embodiment.

In an embodiment, the folding area FA of the polarization film PN2 has a width less than a width of the non-folding area NA. As illustrated in FIG. 13, the polarization film PN2 in the folding area FA may have a width less than a width of the polarization film PN2 in the non-folding area NA, so that it may not be laser-cut only in the folding area FA. FIG. 13 is a view illustrating a polarization film having a less width at a folding area according to an embodiment. In an embodiment, as illustrated in FIG. 13, the polarization film PN2 has
a small width within the cutting line CL only in the folding
area FA, so that there is no cutting operation only in the
folding area FA and a laser cutting operation is performed in
the remaining non-folding area at the time of laser cutting.
Accordingly, no crack is generated in the polarization film
PN2 only in the folding area FA. The deformation portion
320 is not disposed at the folding area FA. That is, the
polarization film PN2 does not include the deformation
portion 320 only at the edge of the folding area FA of the
base substrate 310.

Figure 14:
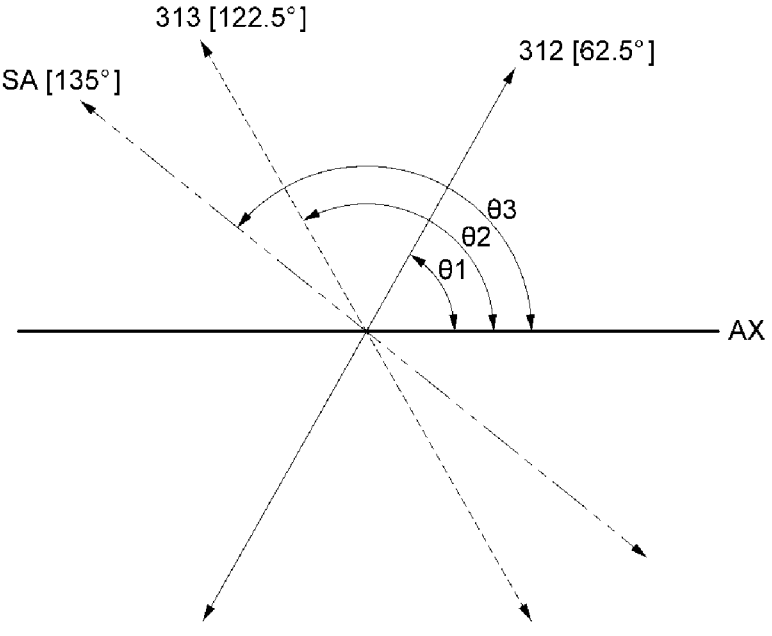
FIG. 14 is a view illustrating a relationship between a stretched axis, a folding axis, and a phase retardation layer of a polarization film according to an embodiment.

In the polarization film PN2, the stretched axis SA forms
an angle of less than about 45° with the folding axis AX, or
forms an angle θ3 of about 135° or more, as illustrated in
FIG. 14. FIG. 14 is a view illustrating a relationship between
a stretched axis, a folding axis, and a phase retardation layer
of a polarization film according to an embodiment. In FIG.
14, the ½λ phase retardation layer 312 has an angle θ1 of
about 62.5° with respect to the folding axis AX. The ¼λ
phase retardation layer 313 has an angle θ2 of about 122.5°
with respect to folding axis AX.

The stretched axis SA forms an angle of less than about
45° with the folding axis AX, but may be parallel to the light
absorption axis. The folding axis AX may form an angle of
less than about 45° with the light absorption axis.

The stretched axis SA may be perpendicular to the light
transmission axis. The folding axis AX may form an angle
of less than about 135° with the light transmission axis. The
polarization film PN2 may substantially prevent reflection of
external light. The external light may pass through the linear
polarization layer 311. In such an embodiment, the light
transmitted through the linear polarization layer 311 may be
a linearly polarized light in which only components perpen-
dicular to the polarization axis of the linear polarization
layer 311 exist.

The light transmitted through the linear polarization layer
311 may pass through the phase retardation layer 312. The
light transmitted through the phase retardation layer 312
may be a circularly polarized light whose phase is delayed
by about ½λ by the ½λ phase retardation layer 313. The
light transmitted through the phase retardation layer 312
may be a circularly polarized light whose phase is delayed
by about ¼λ by the ¼λ phase retardation layer 314.

The light transmitted through the phase retardation layer
312 may be reflected by the display panel PN1. The light
(hereinafter, "reflected light") reflected from the display
panel PN1 may maintain a circularly polarized state.

The reflected light may pass through the phase retardation
layer 312 once again. The light transmitted through the
phase retardation layer 312 may be a linearly polarized light
having a phase delayed by about ¼λ by the ¼λ phase
retardation layer 314. The light transmitted through the
phase retardation layer 312 may be a linearly polarized light
having phase delayed by about ½λ by the ½λ phase
retardation layer 313.

The reflected light transmitted through the phase retarda-
tion layer 312 may be parallel to the polarization axis of the
linear polarization layer 311. Accordingly, the reflected light
transmitted through the phase retardation layer 312 may not
pass through the linear polarization layer 311 and may be
absorbed by the linear polarization layer 311.

In an embodiment according to the invention, a polariza-
tion film in which damages in a folding area in a process of
manufacturing a foldable display device are substantially
minimized, and a display device including the polarization
film may be realized as described above.

As set forth herein, according to one or more embodi-
ments of the invention, when a polarization layer is cut, in
a state of being attached to a display panel, no crack may
occur in a folding area, or even if crack occur in the folding
area, the crack has a predetermined size or less.

Accordingly, in such an embodiment, the life of the
folding area of the foldable display device may be extended,
and the quality of the folding area may be improved.

In such an embodiment, a layer cutting process may be
performed without using a high-end laser, such as Femto,
and thus the facility investment cost of the foldable display
device may be reduced.

While the invention has been illustrated and described
with reference to the embodiments thereof, it will be appar-
ent to those of ordinary skill in the art that various changes
in form and detail may be made thereto without departing
from the spirit and scope according to an embodiment.

What is claimed is:
1. A display device comprising:
a display panel comprising: a folding area in which a
folding axis is defined, and a non-folding area neigh-
boring the folding area;
a first adhesive layer on the display panel; and
a polarization film on the first adhesive layer, wherein a
stretched axis is defined in the polarization film,
wherein an angle between the folding axis and the
stretched axis is less than about 45°,
wherein the polarization film comprises:
a base substrate in which the stretched axis is defined; and
a deformation portion located at an edge of the base
substrate,
wherein the deformation portion has a greater width in the
non-folding area than a width thereof in the folding
area.
2. The display device of claim 1, wherein the stretched
axis is parallel to the folding axis.
3. The display device of claim 1, wherein the polarization
film comprises a base substrate including a linear polariza-
tion layer in which the stretched axis is defined, and a phase
retardation layer on the linear polarization layer.
4. The display device of claim 1, wherein the folding axis
forms an angle of less than about 135° with a light trans-
mission axis of the linear polarization layer.
5. The display device of claim 1, wherein the polarization
film is disposed on a triacetyl cellulose (TAC) film, the TAC
film being attached to the phase retardation layer by a
pressure sensitive adhesive (PSA).
6. The display device of claim 1, further comprising a
hard-coating triacetyl cellulose (HC-TAC) film disposed on
the base substrate of the polarization film, and a protective
film disposed on the HC-TAC film.
7. The display device of claim 1, wherein at an edge of the
base substrate of the folding area of the polarization film,
only a thermally denatured portion and a color-shifting
portion are present, and a recessed portion is absent.
8. The display device of claim 1, wherein the first adhe-
sive layer includes a plurality of transparent silicon beads in
the non-folding area, each bead having an outer diameter
less than a thickness of the first adhesive layer and in a range
from about 1% to about 95% of the thickness of the first
adhesive layer.
9. The display device of claim 1, further comprising a
window substrate including a first base film disposed on a
second adhesive layer, with a third adhesive layer, a second
base film, and a functional layer sequentially stacked on the
first base film.

10. The display device of claim 1, wherein the phase retardation layer comprises a $\frac{1}{2}\lambda$ phase retardation layer and a $\frac{1}{4}\lambda$ phase retardation layer.

11. The display device of claim 10, wherein an ultraviolet adhesive is disposed between the $\frac{1}{2}\lambda$ phase retardation layer and the $\frac{1}{4}\lambda$ phase retardation layer.

12. The display device of claim 1, wherein the base substrate comprises:

a linear polarization layer in which the stretched axis is defined; and a phase retardation layer on the linear polarization layer.

13. The display device of claim 12, wherein the deformation portion comprises a first deformation portion extending in a direction perpendicular to the folding axis; and a second deformation portion extending in a direction parallel to the folding axis.

14. The display device of claim 13, wherein the first deformation portion is not disposed at the folding area located at the edge of the base substrate.

15. The display device of claim 13, wherein the second deformation portion has a width greater than a width of the first deformation portion.

16. The display device of claim 13, wherein the second deformation portion has a plurality of recesses arranged at regular intervals.

\* \* \* \* \*